(12) United States Patent
Yim

(10) Patent No.: US 9,153,318 B2  
(45) Date of Patent: Oct. 6, 2015

(54) SEMICONDUCTOR DEVICE, AND MICROPROCESSOR, PROCESSOR, SYSTEM, DATA STORAGE SYSTEM AND MEMORY SYSTEM INCLUDING THE SEMICONDUCTOR DEVICE FOR GENERATING CURRENT SUPPLIED TO WRITE PATH

(71) Applicant: SK HYNIX INC., Icheon (KR)

(72) Inventor: Hyuck-Sang Yim, Icheon (KR)

(73) Assignee: SK Hynix Inc., Icheon (KR)

( * ) Notice: Subject to any disclaimer, the term of this patent is extended or adjusted under 35 U.S.C. 154(b) by 196 days.

(21) Appl. No.: 13/951,233

(22) Filed: Jul. 25, 2013

(65) Prior Publication Data
US 2014/0313812 A1    Oct. 23, 2014

(30) Foreign Application Priority Data
Apr. 22, 2013   (KR) .................. 10-2013-0044302

(51) Int. Cl.
G11C 11/00    (2006.01)
G11C 13/00    (2006.01)
G11C 11/16    (2006.01)

(52) U.S. Cl.
CPC ........ *G11C 13/0069* (2013.01); *G11C 11/1675* (2013.01); *G11C 11/16* (2013.01); *G11C 13/0004* (2013.01); *G11C 13/0007* (2013.01)

(58) Field of Classification Search
USPC .......................... 365/148, 157, 163, 189.09
See application file for complete search history.

(56) References Cited

U.S. PATENT DOCUMENTS

2011/0216577 A1*  9/2011  Tomotani et al. ............. 365/148
2011/0228585 A1*  9/2011  Kim et al. ..................... 365/148

FOREIGN PATENT DOCUMENTS

KR  10-2010-0131710 A  12/2010
KR  10-2011-0119276 A  11/2011

* cited by examiner

*Primary Examiner* — Vu Le (57) ABSTRACT

A semiconductor device includes: a write current generator configured to generate a write current corresponding to a write reference voltage in a write mode and to have a negative feedback structure. The semiconductor device may further comprise a variable resistance device configured to have a resistance value that varies with the write current.

17 Claims, 9 Drawing Sheets

SEMICONDUCTOR DEVICE, AND MICROPROCESSOR, PROCESSOR, SYSTEM, DATA STORAGE SYSTEM AND MEMORY SYSTEM INCLUDING THE SEMICONDUCTOR DEVICE FOR GENERATING CURRENT SUPPLIED TO WRITE PATH

CROSS-REFERENCE TO RELATED APPLICATION

The present application claims priority of Korean Patent Application No. 10-2013-0044302, filed on Apr. 22, 2013, which is incorporated by reference herein in its entirety.

BACKGROUND

1. Field

Embodiments of the present disclosure relate to a semiconductor device design technology, and more particularly, to a semiconductor device, and a microprocessor, a processor, a system, a data storage system, and a memory system including the semiconductor device.

2. Description of the Related Art

As electronic devices become smaller and more diverse with high performance and low power consumption, semiconductor devices capable of storing data in these small and diverse electronic devices (e.g., computers and portable communication devices) have been developed. Among the semiconductor devices for storing data are storage devices to switch between different resistance levels, such as a Resistive Random Access Memory (RRAM) device, a Phase-change Random Access Memory (PRAM) device, a Ferroelectric Random Access Memory (FRAM) device, a Magneto-resistive Random Access Memory (MRAM) device, an e-fuse and the like.

SUMMARY

An embodiment of the present disclosure is directed to a semiconductor device for generating a current supplied to a write path in a write mode with a predetermined driving voltage, and a microprocessor, a processor, a system, a data storage system and a memory system including the semiconductor device.

In accordance with a first embodiment of the present disclosure, a semiconductor device includes: a write current generator configured to generate a write current corresponding to a reference voltage in a write mode and to have a negative feedback structure; and a variable resistance device configured to have a resistance value that varies with the reference current.

In accordance with a second embodiment of the present disclosure, a semiconductor device includes: a reference voltage generator configured to generate a reference voltage in a write mode; a comparison unit configured to compare a voltage at a supply node with the reference voltage and to produce a comparison result; a write current supplier configured to supply a predetermined write current to the supply node based on the comparison result of the comparison unit; and a variable resistance device configured to have a resistance value that varies with the write current.

In accordance with a third embodiment of the present disclosure, a semiconductor device includes: a variable resistance device configured to have a resistance value that varies with a current flowing though both ends; a current transfer path configured to transfer a write current for writing a data to the variable resistance device and a read current for reading the data to the variable resistance device; a write circuit configured to generate the write current and supply the write current to the current transfer path in a write mode; and a read circuit configured to generate the read current and supply the read current to the current transfer path in a read mode, wherein the write circuit includes: a write reference voltage generator configured to generate a write reference voltage; and a write reference current generator configured to generate the write current corresponding to the write reference voltage, and to have a negative feedback structure.

In accordance with a fourth embodiment of the present disclosure, a microprocessor includes: a controller configured to receive a signal including an external command and to perform extracting, decoding, inputting, and outputting of the external command; an operation unit configured to perform an operation in response to the decoded external command of the control unit; and a memory configured to store any of input data on which the operation is performed, output data corresponding to an result of performing the operation, and an address of the input data on which the operation is performed, wherein the memory includes: a write current generator configured to generate a write current corresponding to a reference voltage in a write mode and to have a negative feedback structure; and a variable resistance device configured to have a resistance value that varies with the write current.

In accordance with a fifth embodiment of the present disclosure, a processor includes: a core unit configured to receive an external command and to perform an operation on input data according to the external command; a cache memory unit configured to store any of the input data on which the operation is performed, output data corresponding to a result of performing the operation, and an address of the input data on which the operation is performed; and a bus interface configured to transmit data between the core unit and the cache memory, the bus interface being coupled between the core unit and the cache memory unit, wherein the cache memory unit includes: a write current generator configured to generate a write current corresponding to a reference voltage in a write mode and to have a negative feedback structure; and a variable resistance device configured to have a resistance value that varies with the write current.

In accordance with another embodiment of the present disclosure, a system includes: a processor configured to decode a command inputted from an external device and control an operation on data according to a result of decoding the command; an auxiliary memory device configured to store a program code for decoding the command and storing the data; a main memory device configured to call and store the program code and the data from the auxiliary memory device such that the processor performs the operation using the program code and the data when the program is executed; and an interface device configured to perform a communication between the external device and at least one of the processor, the auxiliary memory device, and the main memory device, wherein at least one between the auxiliary memory device and the main memory device includes: a write current generator configured to generate a write current corresponding to a reference voltage in a write mode and to have a negative feedback structure; and a variable resistance device configured to have a resistance value that varies with the write current.

In accordance with a sixth embodiment of the present disclosure, a data storage system includes: a storage device configured to store data and retain the stored data even when power supply is cut off; a controller configured to control input and output of data to and from the storage device in response to a command received from an external device; a temporary storage device configured to temporarily store data transmitted between the storage device and the external device; and an interface device configured to perform a communication between the external device and at least one of the storage device, the controller, and the temporary storage device, wherein at least one of the storage device and the temporary storage device includes: a write current generator configured to generate a write current corresponding to a reference voltage in a write mode and to have a negative feedback structure; and a variable resistance device configured to have a resistance value that varies with the write current.

In accordance with an embodiment of the present disclosure, a memory system includes: a memory configured to store data and retain the stored data even when power supply is cut off; a memory controller configured to control input and output of data to and from the memory in response to a command received from an external device; a buffer memory configured to buffer data transmitted between the memory and the external device; and an interface configured to perform communication between the external device and at least one of the memory, the memory controller, and the buffer memory, wherein at least one of the memory and the buffer memory includes: a write current generator configured to generate a write current corresponding to a reference voltage in a write mode and to have a negative feedback structure; and a variable resistance device configured to have a resistance value that varies with the write current.

DETAILED DESCRIPTION

Embodiments of the present disclosure will be described below in more detail with reference to the accompanying drawings. The present disclosure may, however, include embodiments in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of embodiments. When a first layer is referred to as being "on" a second layer or "on" a substrate, it not only refers to a case where the first layer is formed directly on the second layer or the substrate but also a case where a third layer exists between the first layer and the second layer or the substrate.

A semiconductor device in accordance with an embodiment of the present disclosure may include a variable resistance device. Hereafter, the variable resistance device may show a variable resistance characteristic and include a single layer or multiple layers. For example, the variable resistance device may include a material used for a Resistive Random Access Memory (RRAM) device, a Phase-change Random Access Memory (PRAM) device, a Ferroelectric Random Access Memory (FRAM) device, a Magneto-resistive Random Access Memory (MRAM) device and the like. Specifically, the variable resistance device may include a chalcogenide-based compound, a transition metal compound, a ferrodielectric substance, a ferromagnetic substance, and so forth. However, the scope and spirit of the present disclosure are not limited to these materials, and the variable resistance device is a device showing a variable resistance characteristic that switches between different resistance levels according to voltages applied to or a current flowing through both ends.

In an embodiment, the variable resistance device may include a metal oxide. The metal oxide may include a transition metal oxide, such as a nickel (Ni) oxide, a titanium (Ti) oxide, a hafnium (Hf) oxide, a zirconium (Zr) oxide, a tungsten (W) oxide, and/or a cobalt (Co) oxide; and/or a perovskite-based material, such as STO (SrTiO), and PCMO (PrCaMnO). The variable resistance device has a characteristic of switching between different resistance levels as current filaments are formed or disappeared due to migration of vacancies.

Also, the variable resistance device may include a phase-change material. In an embodiment, the phase-change material may be a chalcogenide-based material, such as GST (Ge—Sb—Te). The variable resistance device may have the characteristic of switching between different resistance levels when the phase-change material has a crystalline or an amorphous structure as a result of heating of the material (e.g., Joule heating).

Also, the variable resistance device may include a multi-layer structure where a tunnel barrier layer is interposed between two magnetic layers. In an embodiment, the magnetic layers may be formed of NiFeCo or CoFe, and the tunnel barrier layer may be formed of aluminum oxide ($Al_2O_3$). The variable resistance device has the characteristic of switching between different resistance levels according to magnetization directions of the two magnetic layers. For example, the variable resistance device may have a low resistance level when the magnetization directions of the two magnetic layers are in parallel. When the magnetization directions of the two magnetic layers are in anti-parallel, the variable resistance device may have a high resistance level.

Figure 1:
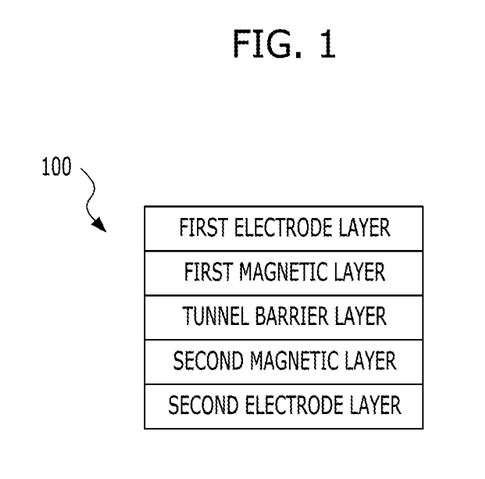
FIG. 1 illustrates a magnetic tunnel junction (MTJ) structure where a tunnel barrier layer is interposed between two magnetic layers in accordance with an embodiment.

FIG. 1 illustrates a magnetic tunnel junction (MTJ) structure where a tunnel barrier layer is interposed between two magnetic layers in accordance with an embodiment.

Referring to FIG. 1, the MTJ includes a first electrode layer as an upper electrode, a second electrode layer as a lower electrode, a first magnetic layer and a second magnetic layer as a pair of magnetic layers, and a tunnel barrier layer that is formed between the pair of magnetic layers.

The first magnetic layer is a free ferromagnetic layer whose magnetization direction may change according to a direction and a magnitude of a current applied to the MTJ, whereas the second electrode layer may be a pinned ferromagnetic layer whose magnetization direction is fixed.

The MTJ records data of '0' or '1' when its resistance level is switched according to the direction and magnitude of the current flowing through the MTJ.

Figure 2A:
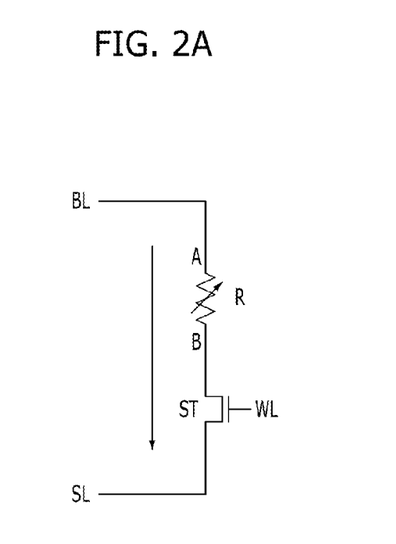
FIGS. 2A and 2B illustrate how data is written in a variable resistance device.
Figure 2B:
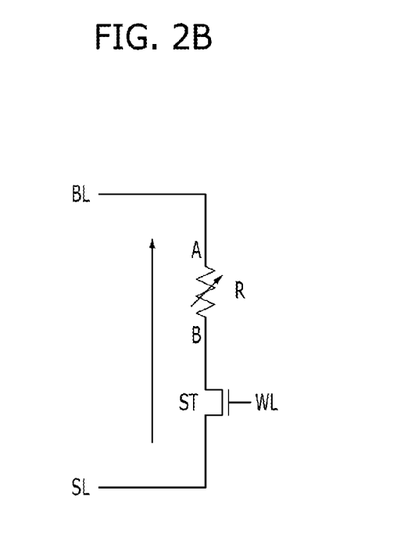

FIGS. 2A and 2B illustrate how data is written in a variable resistance device R. The variable resistance device R may be the MTJ shown in FIG. 1.

First of all, FIG. 2A describes an operation of writing logic low data '0' in a variable resistance device R. In order to select the variable resistance device R for storing the data in a particular memory cell, a word line WL coupled with the variable resistance device R is enabled to turn on a selection transistor ST. In FIG. 2A, a current flows from one end A of the variable resistance device R to its other end B, as indicated by a vertically downward arrow. Specifically, the current flows from the first electrode layer (e.g., the upper electrode in FIG. 1) to the second electrode layer (e.g., the lower electrode in FIG. 1). In this case, the magnetization direction of the first magnetic layer (e.g., the free ferromagnetic layer in FIG. 1) and that of the second magnetic layer (e.g., the pinned ferromagnetic layer in FIG. 1), become parallel to each other, so that the variable resistance device R is set to a low resistance state. When the variable resistance device R is in a low resistance state, the logic low data '0' is stored in the variable resistance device R.

FIG. 2B describes an operation of writing logic high data '1' in a variable resistance device R. In order to select the variable resistance device R for storing the data in a particular memory cell, a word line WL coupled with the variable resistance device R is configured to turn on a selection transistor ST. In FIG. 2B, a current flows from one end B of the variable resistance device R, to its other end A, as indicated by a vertically upward arrow. Specifically, the current flows from the second electrode layer (e.g., the lower electrode in FIG. 1) to the first electrode layer (e.g., the upper electrode in FIG. 1). In this case, the magnetization direction of the first magnetic layer (e.g., the free ferromagnetic layer in FIG. 1) and the magnetization direction of the second magnetic layer (e.g., the pinned ferromagnetic layer in FIG. 1) become anti-parallel to each other, so that the variable resistance device R is set to a high resistance state. When the variable resistance device R is in a high resistance state, logic high data '1' is stored in the variable resistance device R.

Figure 3:
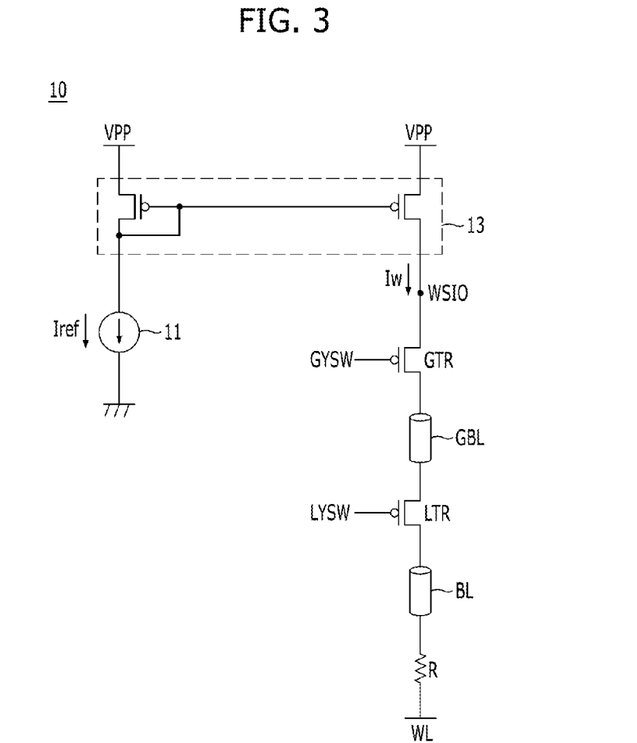
FIG. 3 is a circuit diagram illustrating a write path of a semiconductor device in accordance with an embodiment.

FIG. 3 is a circuit diagram illustrating a write path of a semiconductor device in accordance with an embodiment.

Referring to FIG. 3, the semiconductor device 10 includes a current source 11 configured to generate a reference current Iref, a current mirror 13 configured to mirror the reference current Iref and supply a write current Iw to a write node WSIO, a current path GTR, GBL, LTR and BL through which the write current Iw flows, and a variable resistance device R whose resistance value varies with the write current Iw.

Meanwhile, the current path GTR, GBL, LTR and BL includes a global switching unit GTR which is enabled by a global selection signal GYSW, a global bit line GBL, a local switching unit LTR which is enabled by a local selection signal LYSW, and a local bit line BL, all of which are serially coupled with each other between the write node WSIO and the variable resistance device R. Hereinafter, the operation of the semiconductor device 10 having the above structure will be described.

When the current source 11 generates the reference current Iref, the write current Iw is supplied to the write node WSIO through the current mirror 13.

When the global selection signal GYSW and the local selection signal LYSW are enabled, the write current Iw flows into the variable resistance device R. Predetermined logic data is written corresponding to the resistance state of the variable resistance device R (e.g., a high resistance state or a low resistance state), which is determined by the magnitude of the write current Iw.

Figure 4:
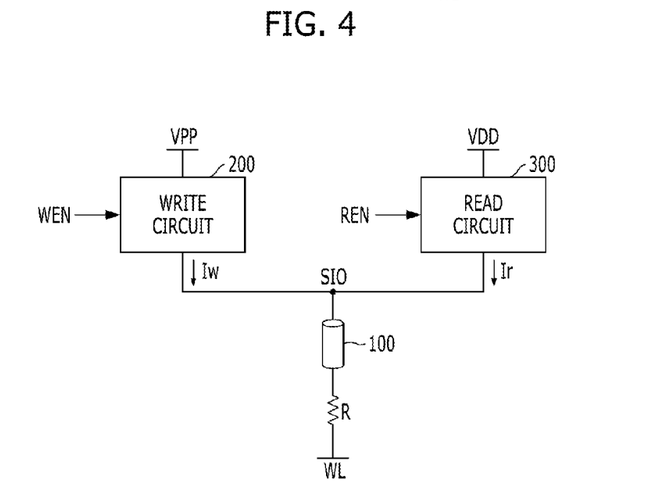
FIG. 4 is a block diagram illustrating a semiconductor device in accordance with an embodiment.

FIG. 4 is a block diagram illustrating a semiconductor device in accordance with an embodiment.

Referring to FIG. 4, the semiconductor device includes a variable resistance device R whose resistance value varies with a current flowing through both ends; a current transfer path 100 configured to transfer a write current Iw for a write operation that is used to write a data to the variable resistance device R, and a read current Ir for a read operation that is used to read a data from the variable resistance device R; a write circuit 200 for generating the write current Iw and supplying the write current Iw to the current transfer path 100 in a write mode; and a read circuit 300 for generating the read current Ir and supplying the read current Ir to the current transfer path 100 in a read mode.

The write circuit 200 and the read circuit 300 are controlled by corresponding enable signals WEN and REN, respectively. Specifically, the write circuit 200 supplies the write current Iw to the current transfer path 100 in response to the write enable signal WEN, whereas the read circuit 300 supplies the read current Ir to the current transfer path 100 in response to the read enable signal REN. Hereinafter, the current transfer path 100 and the write circuit 200 are described in detail with reference to FIG. 5.

Power sources VPP and VDD supply power supply voltages to the write circuit 200 and the read circuit 300. In an embodiment, the power sources VPP and VDD may supply different voltages to the write circuit 200 and the read circuit 300, respectively.

Figure 5:
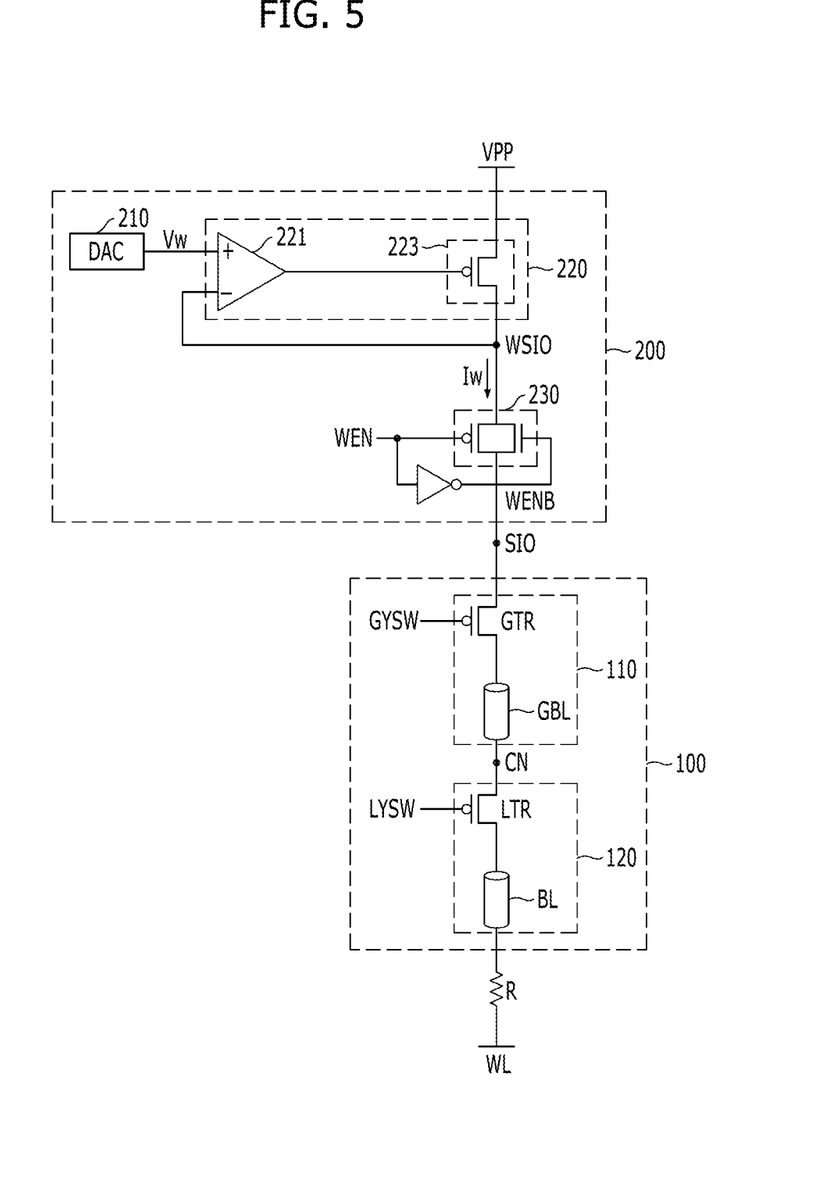
FIG. 5 is a block diagram illustrating a detailed structure of the write circuit and the current transfer path shown in FIG. 4.

FIG. 5 shows the current transfer path 100, the write circuit 200, and the variable resistance device R.

Referring to FIG. 5, the current transfer path 100 includes a global path 110 through which the write current Iw flows from a common node SIO to a coupling node CN in response to a global selection signal GYSW. The current transfer path 100 also includes a local path 120 through which the write current Iw flows from the coupling node CN to the variable resistance device R in response to a local selection signal LYSW. The global path 110 includes a global switching unit GTR that switches in response to the global selection signal GYSW, and a global bit line GBL through which the write current 1*w* flows to the local path 120 through the global switching unit GTR. The local path 120 includes a local switching unit LTR that switches in response to the local selection signal LYSW, and a local bit line BL through which the write current 1*w* flows into the variable resistance device R through the local switching unit LTR.

The write circuit 200 includes a write reference voltage generator 210, a write current generator 220, and a write coupler 230. The write reference voltage generator 210 generates a write reference voltage Vw for a write operation. The write current generator 220 has a negative feedback structure, and it generates a write current Iw when a voltage at a supply node WSIO corresponds to the write reference voltage Vw. The write coupler 230 selectively couples the supply node WSIO and the common node SIO in response to the write enable signal WEN, so that the write current Iw flows to the current transfer path 100.

Herein, the write reference voltage generator 210 generates different levels of the write reference voltage Vw that are needed in a write mode and a program and verification (PNV) mode. For example, the write reference voltage generator 210 may include a digital-to-analog converter (DAC). The write current generator 220 includes a comparison unit 221 for comparing the voltage at the supply node WSIO with the write reference voltage Vw, and a write current supplying unit 223 for supplying the write reference voltage Vw to the supply node WSIO using the comparison result obtained in the comparison unit 221. For example, the write current supplying unit 223 may include a pull-up driver for driving the supply node WSIO with a predetermined driving voltage VPP in response to the comparison result of the comparison unit 221. Also, the write coupler 230 includes a transmission gate that allows the write current Iw to flow in response to the write enable signal WEN and a write enable bar signal WENB, which are complementary gate signals.

Hereafter, the operation of the semiconductor device having the above-described structure in accordance with an embodiment will be described. Herein, the operation in the write mode is described in detail.

While the write coupler 230 is turned on in response to the enabling of the write enable signal WEN, when the write reference voltage generator 210 generates a predetermined level of the write reference voltage Vw, the write current generator 220 supplies a write current Iw to the supply node WSIO whose voltage level corresponds to approximately the voltage reference voltage Vw.

The operation of the write current generator 220 is described in more detail as follows. The comparison unit 221 compares the voltage at the supply node WSIO with the write reference voltage Vw and outputs a comparison result to a gate of a PMOS in the write current supplying unit 223. The write current supplying unit 223 drives the supply node WSIO with a predetermined voltage VPP according to the comparison result from the comparison unit 221. For example, if the voltage level at the supply node WSIO is smaller than the level of the write reference voltage Vw, the current supplying unit 223 increases the voltage at the supply node WSIO, and vice versa. In this manner, the voltage at the supply node WSIO is rapidly stabilized to approximately the level of the write reference voltage Vw. Due to such a negative feedback scheme of the write current generator 220, the voltage at the supply node WSIO becomes rapidly stabilized, so that a saturation current flowing through the PMOS transistor in the write current supplying unit 223 becomes the same as the write current Iw flowing through the write coupler 230, the current transfer path 100, and the variable resistance device R. Herein, the write current Iw is determined based on the ratio of the stabilized voltage at the supply node WSIO (i.e., approximately equal to Vw) to the total resistance Rtotal due to the write coupler 230, the current transfer path 100, and the variable resistance device R (i.e., Iw=Vw/Rtotal).

Figure 6:
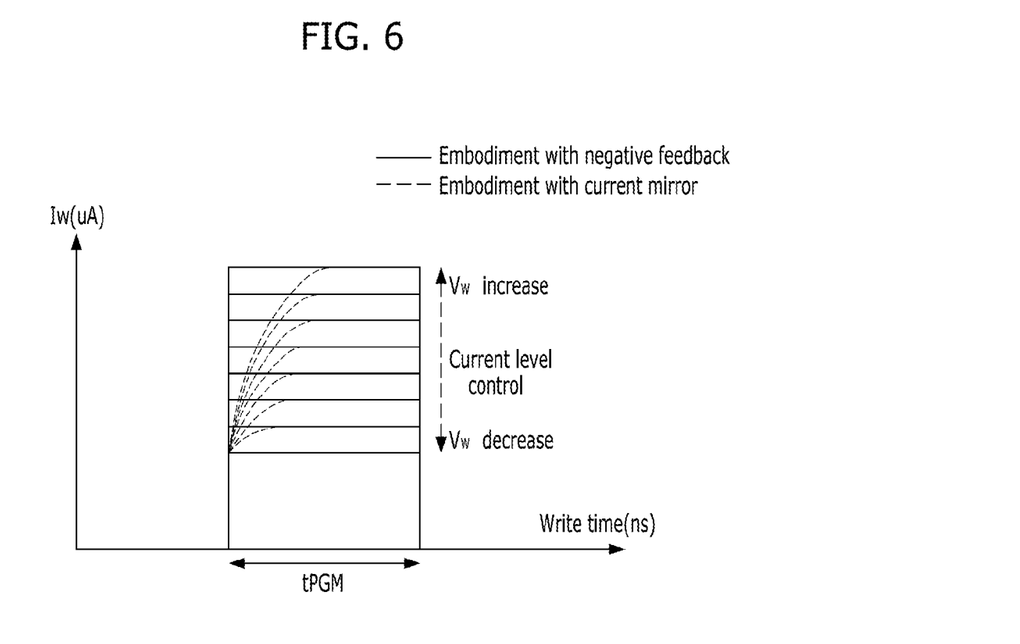
FIG. 6 is a graph showing currents Iw for a write operation generated in accordance with embodiments shown in FIGS. 3 and 4.

FIG. 6 is a graph showing write currents Iw as a function of time in accordance with an embodiment having a current mirror structure and another embodiment having a negative feedback structure. Referring to FIG. 6, the write currents Iw according to an embodiment having the negative feedback structure show approximately ideal pulse shapes. This signifies that a rising time of the write current Iw of this embodiment having the negative feedback structure is shorter than a corresponding time of the other embodiment having the current mirror. As a result, the quality of the write current Iw may be secured regardless of the total RC loading of the write coupler 230, the current transfer path 100, and the variable resistance device R, when the write current Iw is supplied using the negative feedback structure. FIG. 6 also shows that the level of the write current Iw may be controlled using the write reference voltage Vw. For example, as shown in FIG. 6, the level of the write current Iw increases as the level of the write reference voltage Vw increases.

According to an embodiment having the negative feedback structure, since the rising time of the write current Iw is short, a write time tPGM taken for performing a write operation of this embodiment may also be shorter than that of another embodiment. In this way, power consumption of the semiconductor device 10 using a negative feedback method may be lower than that of another embodiment.

Figure 7:
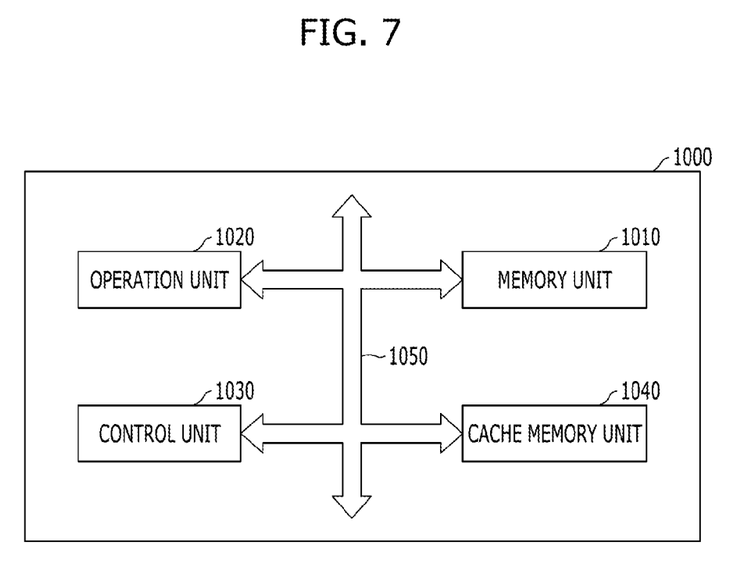
FIG. 7 is a block diagram of a microprocessor in accordance with an embodiment.

FIG. 7 is a block diagram of a microprocessor in accordance with an embodiment.

Referring to FIG. 7, a microprocessor 1000 may perform tasks for controlling a series of processes of receiving data from various external devices, processing the data, and outputting processing results to the external devices. In an embodiment, the microprocessor 1000 may include a memory unit 1010, an operation unit 1020, and a control unit 1030. For example, the microprocessor 1000 may include various types of processing units such as a central processing unit (CPU), a graphic processing unit (GPU), a digital signal processor (DSP) and an application processor (AP).

The memory unit 1010 may be a processor register or a register as a storage part of the microprocessor 1000. For example, the memory unit 1010 may include various types of resisters such as a data register, an address register and a floating point register. The memory unit 1010 may temporarily store input data to be used by the operation unit 1020, output data from the operation unit 1020, and an address of the stored input data. The memory unit 1010 may include one of the semiconductor devices in accordance with an embodiment of the present disclosure. The memory unit 1010 including the semiconductor device in accordance with this embodiment may include a write reference voltage generator configured to generate a reference voltage in a write mode, a write current generator configured to generate a write current current corresponding to the write reference voltage and have a negative feedback structure, and a variable resistance device configured to have a resistance value that varies with the write current. The write current generator may include a comparison unit configured to compare a voltage at a supply node with the write reference voltage and to produce a comparison result, and a write current supplying unit configured to supply the write current to the supply node based on the comparison result of the comparison unit. Since the memory unit 1010 may generate the reference current using the negative feedback structure, the performance of a write operation and power consumption may be improved, compared with another embodiment using the current mirroring method. Accordingly, the overall operation performance and total power consumption of the microprocessor 1000 including the memory unit 1010 may be improved.

The control unit 1030 receives signals including commands from the memory unit 1010, the operation unit 1020, and an external device of the microprocessor 1000. The control unit 1030 also performs extracting and decoding the received commands, and controls processing as instructed by the commands.

The microprocessor 1000 according to an embodiment may additionally include a cache memory unit 1040 which can temporarily store input data from an external device or output data to an external device. In this case, the cache memory unit 1040 may exchange data with the memory unit 1010, the operation unit 1020, and the control unit 1030 through a bus interface 1050.

Figure 8:
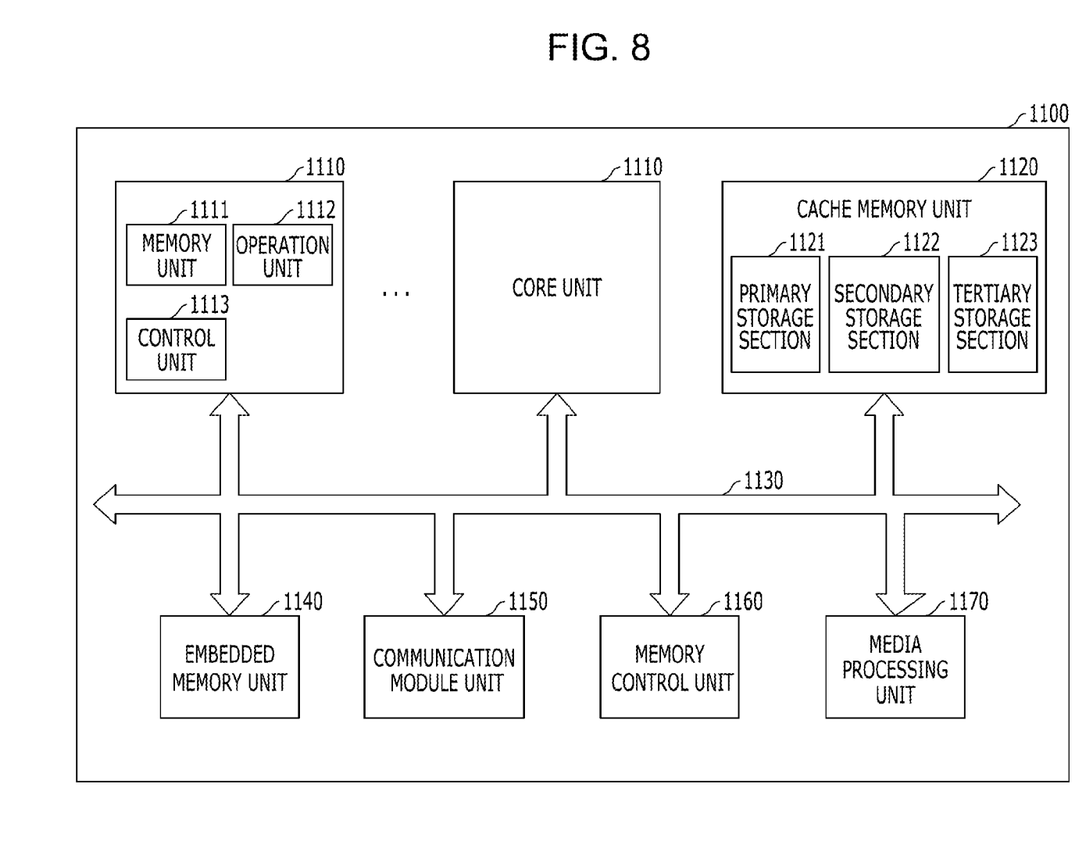
FIG. 8 is a block diagram of a processor in accordance with an embodiment.

FIG. 8 is a block diagram of a processor in accordance with an embodiment.

Referring to FIG. 8, a processor 1100 may improve performance and realize multi-functionality by including various functions in addition to the functions which are typically performed by a microprocessor (e.g. controlling a series of processes of receiving data from various external devices, processing the data, and outputting processing results to external devices). In an embodiment, the processor 1100 may include a core unit 1110, a cache memory unit 1120, and a bus interface 1130. The core unit 1110 of this embodiment may be a part which performs arithmetic logic operations on data inputted from an external device, and may include a memory unit 1111, an operation unit 1112, and a control unit 1113. The processor 1100 may include various types of system-on-chips (SoCs) such as a multi-core processor, a graphic processing unit (GPU) and an application processor (AP).

The memory unit 1111 may be a processor register or a register as a storage part of the processor 1100. For example, the memory unit 1111 may include various types of registers such as a data register, an address register and a floating point register. The memory unit 1111 may temporarily store (i) input data on which operations are performed by the operation unit 1112, (ii) output data from the operation unit 1112, and (iii) an address of the stored input data. The operation unit 1112 is a part which performs various operations in the processor 1100. For example, the operation unit 1112 performs arithmetical operations or logical operations in response to input signals from the control unit 1113. In this case, the operation unit 1112 may include at least one arithmetic logic unit (ALU). The control unit 1113 also receives commands from the memory unit 1111, the operation unit 1112, and an external device. The control unit 1113 performs extracting and decoding the received commands, and controls processing as instructed by the commands.

The cache memory unit 1120 is a part which temporarily stores data to compensate for a difference between a high data processing speed at which the core unit 1110 operates and a low operating speed at which the external device operates. In an embodiment, the cache memory unit 1120 may include a primary storage section 1121, a secondary storage section 1122, and a tertiary storage section 1123. In general, the cache memory unit 1120 includes the primary and secondary storage sections 1121 and 1122. When a high storage capacity is desired, the cache memory unit 1120 may also include the tertiary storage section 1123. When appropriate, the cache memory unit 1120 may include additional storage sections. Thus, a number of storage sections included in the cache memory unit 1120 may vary according to a chip design. The speeds at which the primary, secondary, and tertiary storage sections 1121, 1122 and 1123 store and discriminate data may be substantially the same or different. In the case where the speeds of each storage sections 1121, 1122 and 1123 are different, the primary storage section 1121 may have the fastest operation speed. At least one of the primary storage section 1121, the secondary storage section 1122, and the tertiary storage section 1123 of the cache memory unit 1120 may include one of the semiconductor devices in accordance with an embodiment of the present disclosure described above. The cache memory unit 1120 including the semiconductor device in accordance with this embodiment may include a write reference voltage generator configured to generate a write reference voltage in a write mode, a write current generator configured to generate a write current corresponding to the write reference voltage and have a negative feedback structure, and a variable resistance device configured to have a resistance value that varies with the write current. The write current generator may include a comparison unit configured to compare a voltage at a supply node with the write reference voltage and to produce a comparison result, a write current supplying unit configured to supply the write current to the supply node based on the comparison result of the comparison unit. Since the memory unit 1010 generates the write current using the negative feedback structure, the performance of a write operation and power consumption may be improved compared with another embodiment using the current mirroring method. Accordingly, the overall operation performance and total power consumption of the processor 1100 including the cache memory unit 1120 may be improved. Although it was shown in FIG. 8 that the primary, secondary, and tertiary storage sections 1121, 1122 and 1123 are located inside the cache memory unit 1120, the storage sections 1121, 1122 and 1123 may be located outside the cache memory unit 1120. In addition, as shown in FIG. 8, the primary, secondary, and tertiary storage sections 1121, 1122 and 1123 of the cache memory unit 1120 may be located outside the core unit 1110 to compensate for a difference between data processing speeds at which the core unit 1110 and the external device operate. In another embodiment, the primary storage section 1121 of the cache memory unit 1120 may be located inside the core unit 1110 and the secondary storage section 1122 and the tertiary storage section 1123 may be located outside the core unit 1110 to improve the function of compensating the difference between the data processing speeds.

The bus interface 1130 is a part which connects the core unit 1110 and the cache memory unit 1120 for effective transmission of data.

As shown in FIG. 8, the processor 1100 according to another embodiment may include a plurality of core units 1110, and the plurality of core units 1110 may share the same cache memory unit 1120. The plurality of core units 1110 and the cache memory unit 1120 may be connected through the bus interface 1130. The plurality of core units 1110 may be configured in substantially the same way as the above-described configuration of the core unit 1110. In this embodiment that includes the plurality of core units 1110 in the processor 1100, the primary storage section 1121 of the cache memory unit 1120 may be located in each core unit 1110. The secondary storage section 1122 and the tertiary storage section 1123 may be located outside the plurality of core units 1110, so that these sections 1122 and 1123 can be shared through the bus interface 1130 by other internal elements of the processor 1100 including the plurality of core units 1110. In this embodiment, the processing speed of the primary storage section 1121 may be faster than the processing speeds of the secondary and tertiary storage section 1122 and 1123. The processor 1100 according to an embodiment may further include an embedded memory unit 1140 which stores data, a communication module unit 1150 which can transmit and receive data to and from an external device in a wired or wireless communication, a memory control unit 1160 which controls an external memory device, and a media processing unit 1170 which processes data processed in the processor 1100 or the input data from an external input device and outputs the processed data to an external interface device. Besides, the processor 1100 may include a plurality of modules. In this embodiment, the plurality of modules 1140, 1150, 1160, and 1170 may exchange data with other internal elements of the processor 110 such as the core units 1110 and the cache memory unit 1120 through the bus interface 1130.

The embedded memory unit 1140 may include not only a volatile memory but also a nonvolatile memory. The volatile memory may include a dynamic random access memory (DRAM), a mobile DRAM, a static random access memory (SRAM), and so on. The nonvolatile memory may include a read only memory (ROM), a NOR flash memory, a NAND flash memory, a phase change random access memory (PRAM), a resistive random access memory (RRAM), a spin transfer torque random access memory (STTRAM), a magneto-resistive random access memory (MRAM), and so on.

The communication module unit 1150 may include two communication modules, each of which is capable of being connected with an external device using a wired network or a wireless network. The wired network may use a local area network (LAN), a universal serial bus (USB), an Ethernet, power line communication (PLC), and so on. The wireless network may use Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and so on.

The memory control unit 1160 is to control data transmitted between the processor 1100 and an external memory device according to a different communication standard. The memory control unit 1160 may include various memory controllers, for example, controllers for controlling Integrated Device Electronics (IDE), Serial Advanced Technology Attachment (SATA), Small Computer System Interface (SCSI), Redundant Array of Independent Disks (RAID), a solid state disk (SSD), External SATA (eSATA), Personal Computer Memory Card International Association (PCM-CIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 processes data that has been internally processed by the processor 1100 or data that is input from an external input device, and outputs the processed data to an external interface device in various forms including visual images and sound. For example, the media processing unit 1170 may include a graphic processing unit (GPU), a digital signal processor (DSP), a high definition audio (HD audio), a high definition multimedia interface (HDMI) controller, and so on.

Figure 9:
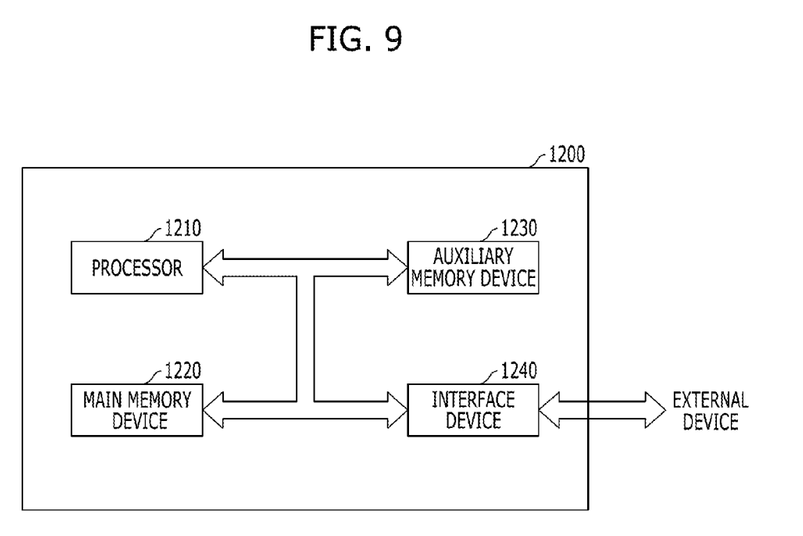
FIG. 9 is a block diagram of a system in accordance with an embodiment.

FIG. 9 is a block diagram of a system in accordance with an embodiment.

Referring to FIG. 9, a system 1200 may perform input, processing, output, and storing data. The system 1200 may include a processor 1210, a main memory device 1220, an auxiliary memory device 1230, and an interface device 1240. In an embodiment, the system 1200 may include various electronic systems which operate using processors, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, a telematics, an audio visual (AV) system, a smart television, and so on.

The processor 1210 performs decoding of inputted commands and processing (e.g., logic operation, comparison, etc.) on the data stored in the system 1200. For example, the processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a memory which can store program codes and necessary data to execute the program codes received from the auxiliary memory device 1230. The main memory device 1220 may retain the stored data even when power supply is cut off. The main memory device 1220 may include one of the semiconductor devices in accordance with an embodiment described above. The main memory device 1220 including the semiconductor device in accordance with this embodiment may include a write reference voltage generator configured to generate a write reference voltage in a write mode, a write current generator configured to generate a write current corresponding to the write reference voltage and have a negative feedback structure, and a variable resistance device configured to have a resistance value that varies with the write current. The write current generator may include a comparison unit for comparing a voltage at a supply node with the write reference voltage and to produce a comparison result, and a write current supplying unit for supplying the write current to the supply node based on the comparison result of the comparison unit. Since the main memory device 1220 may generate the write current using the negative feedback structure, the performance of a write operation and power consumption may be improved compared with the current mirroring method. Accordingly, the overall operation performance and total power consumption of the main memory device 1220 including the main memory device 1220 may be improved. In addition, the main memory device 1220 may further include a volatile memory such as an SRAM and a DRAM in which stored data is lost when power supply is cut off. Alternatively, the main memory device 1220 may not include the semiconductor devices according to an embodiment of the present disclosure, but may include the volatile memory.

The auxiliary memory device 1230 is a memory device for storing program codes or data. While an operation speed of the auxiliary memory device 1230 is typically slower than that of the main memory device 1220, the auxiliary memory device 1230 may store a larger amount of data than the main memory device 1220. The auxiliary memory device 1230 may include one of the semiconductor devices in accordance with an embodiment of the present disclosure. The auxiliary memory device 1230 including the semiconductor device in accordance with this embodiment may include a write reference voltage generator configured to generate a write reference voltage in a write mode, a write current generator configured to generate a write current corresponding to the write reference voltage and have a negative feedback structure, and a variable resistance device configured to have a resistance value that varies with the write current. The write current generator may include a comparison unit configured to compare a voltage at a supply node with the write reference voltage and to produce a comparison result, and a write current supplying unit configured to supply the write current to the supply node based on the comparison result of the comparison unit. Since current and power consumption of the auxiliary memory device 1230 may be reduced using the semiconductor device in accordance with this embodiment, portability of the auxiliary memory device 1230 is improved. In addition, the auxiliary memory device 1230 may further include a data storage system 1300 (see FIG. 10) such as a magnetic tape, a magnetic disk, a laser disk using optics, a magneto-optical disc, a solid state disk (SSD), a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. The auxiliary memory device 1230 may include the data storage system 1300 (see FIG. 10), even when the auxiliary memory device 1230 does not include the semiconductor devices according to an embodiment.

The interface device 1240 may perform exchange of commands and data between the system 1200 and an external device. For example, the interface device 1240 may include a keypad, a keyboard, a mouse, a speaker, a mike, a display, various human interface devices (HIDs), and a communication device. The communication device may include two modules, each of which is capable of being connected in a wired network or a wireless network. The wired network may use a local area network (LAN), a universal serial bus (USB), an Ethernet, power line communication (PLC), and so on. The wireless network may use Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and so on.

Figure 10:
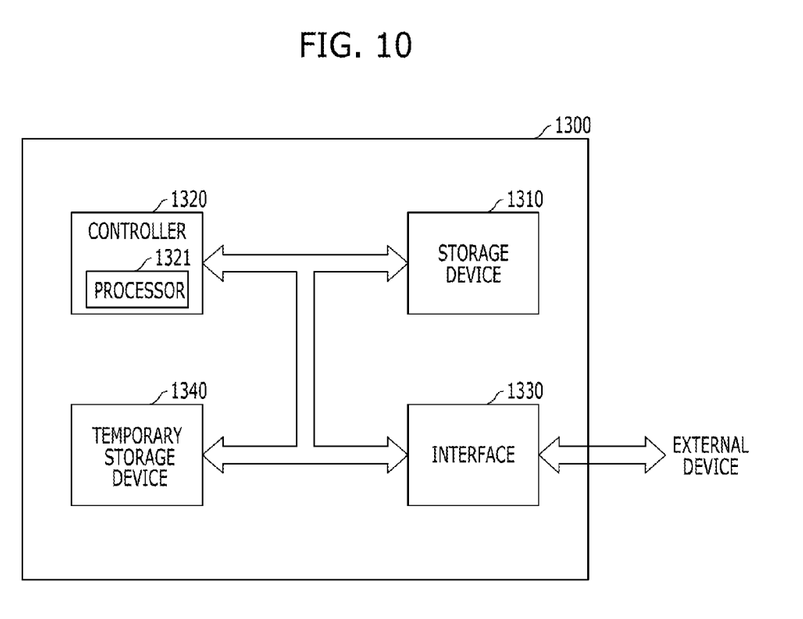
FIG. 10 is a block diagram of a data storage system in accordance with an embodiment.

FIG. 10 is a block diagram of a data storage system in accordance with an embodiment.

Referring to FIG. 10, a data storage system 1300 may include a storage device 1310 which stores data as a nonvolatile memory component, a controller 1320 which controls the storage device 1310, and an interface 1330 which communicates with an external device. For example, the data storage system 1300 may be a disk type device such as a hard disk drive (HDD), a compact disc read only memory (CDROM), a digital versatile disc (DVD), a solid state disk (SSD), and so on, or a card type device such as a universal serial bus memory (USB) memory, a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The controller 1320 may control exchange of data between the storage device 1310 and the interface 1330. To this end, the controller 1320 may include a processor 1321 for performing an operation according to processing commands inputted from an external device through the interface 1330.

The interface 1330 is to perform exchange of commands and data between the data storage system 1300 and the external device. When the data storage system 1300 is a card type device, the interface 1330 may be an interface which is compatible with a USB memory, an SD card, an mSD card, a micro SD card, a SDHC card, a memory stick card, a SM card, a MMC, an eMMC, a CF card, and so on. In the case where the data storage system 1300 is a disk type device, the interface 1330 may be an interface which is compatible with a HDD, a CDROM, a DVD, an SSD, and so on.

The data storage system 1300 according to an embodiment of the present disclosure may further include a temporary storage device 1340 for efficiently transferring data between the interface 1330 and the storage device 1310, which results from diverse and enhanced performance of the interface 1330 interacting with an external device, a controller 1320 and a system 1300. The storage device 1310 and the temporary storage device 1340 for temporarily storing data may include one of the semiconductor devices in accordance with an embodiment of the present disclosure. The storage device 1310 or the temporary storage device 1340 including the semiconductor device in accordance with this embodiment may include a write reference voltage generator configured to generate a write reference voltage in a write mode, a write current generator configured to generate a write current corresponding to the write reference voltage and have a negative feedback structure, and a variable resistance device configured to have a resistance value that varies with the write current. The write current generator may include a comparison unit configured to compare a voltage at a supply node with the write reference voltage and to produce a comparison result, and a write current supplying unit configured to supply the write current to the supply node based on the comparison result of the comparison unit. Since current and power consumption of the storage device 1310 and the temporary storage device 1340 may be reduced using the semiconductor device in accordance with this embodiment, portability of the data storage system 1300 is improved.

Figure 11:
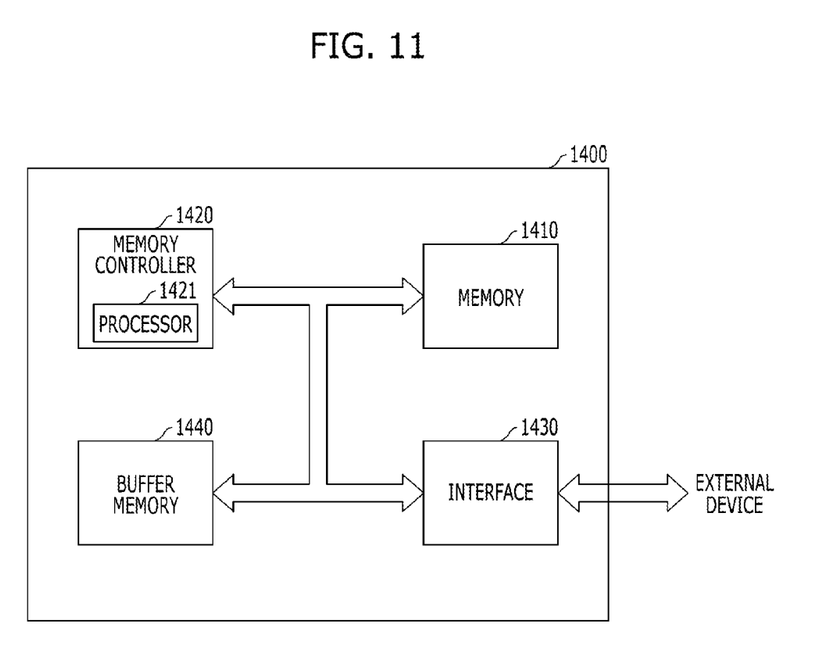
FIG. 11 is a block diagram of a memory system in accordance with an embodiment.

FIG. 11 is a block diagram of a memory system in accordance with an embodiment.

Referring to FIG. 11, a memory system 1400 may include a memory 1410 which stores data as a nonvolatile memory component, a memory controller 1420 which controls the memory 1410, and an interface 1430 which communicates with an external device. The memory system 1400 may be a card type device such as an SSD, a USB memory, an SD card, an mSD card, a micro SD card, an SDHC card, a memory stick card, an SM card, an MMC, an eMMC, a CF card, and so on.

The memory 1410 for storing data may include one of the semiconductor devices in accordance with an embodiment of the present disclosure. The memory 1410 including the semiconductor device in accordance with this embodiment may include a write reference voltage generator configured to generate a write reference voltage in a write mode, a write current generator configured to generate a write current corresponding to the write reference voltage and have a negative feedback structure, and a variable resistance device having a resistance value that varies with the write current. The write current generator may include a comparison unit for comparing a voltage at a supply node with the write reference voltage and to produce a comparison result, and a write current supplying unit for supplying the write current to the supply node based on the comparison result of the comparison unit. Since current and power consumption of the memory 1410 may be reduced using the semiconductor device in accordance with this embodiment, portability of the memory 1410 is improved. In addition, the memory 1410 according to this embodiment may further include a ROM, a NOR flash memory, a NAND flash memory, a PRAM, a RRAM, an MRAM, and so on, which have a nonvolatile characteristic.

The memory controller 1420 may control exchange of data between the memory 1410 and the interface 1430. To this end, the memory controller 1420 may include a processor 1421 for performing an operation according to processing commands inputted from an external device through the interface 1430.

The interface 1430 is to perform exchange of commands and data between the memory system 1400 and the external device. The interface 1430 may be compatible with a USB memory, an SD card, an mSD card, a micro SD card, an SDHC card, a memory stick card, an SM card, an MMC, an eMMC, a CF card, and so on.

The memory system 1400 according to an embodiment of the present disclosure may further include a buffer memory 1440 for efficiently transferring data between the interface 1430 and the memory 1410, which results from diverse and enhanced performance of the interface 1430 interacting with the external device, the memory controller 1420 and the memory 1410. The buffer memory 1440 that temporarily stores data may include one of the semiconductor devices in accordance with an embodiment of the present disclosure. The buffer memory 1440 including the semiconductor device in accordance with this embodiment may include a variable resistance device, a storage unit configured to store information according to a switching frequency and a minimum pulse width, and a driving unit configured to generate a driving voltage in response to the stored information and to supply the driving voltage to two terminals of the variable resistance device. Since current and power consumption of the buffer memory 1440 may be reduced using the semiconductor device in accordance with this embodiment, portability of the memory system 1400 including the buffer memory 1440 is improved.

Moreover, the buffer memory 1440 according to the present embodiment may further include a volatile memory such as an SRAM and a DRAM, or a nonvolatile memory such as a PRAM, an RRAM, an STTRAM, and an MRAM. The buffer memory 1440 may include the volatile memory or the nonvolatile memory, even when the buffer memory 1440 does not include the semiconductor devices according to an embodiment of the present disclosure.

According to the semiconductor device and the method for fabricating the same in accordance with embodiments of the present disclosure, processing data may be simplified, and interference between neighboring cells may be reduced.

Although various embodiments have been described for illustrative purposes, it will be apparent to those skilled in the art that various changes and modifications may be made without departing from the spirit and scope of the present disclosure as defined in the following claims.

While the present invention has been described with respect to specific embodiments of the present disclosure, it will be apparent to those skilled in the art that various changes and modifications may be made without departing from the spirit and scope of the present disclosure as defined in the following claims.

What is claimed is:

1. A semiconductor device, comprising:
a write current generator configured to generate a write current corresponding to a write reference voltage in a write mode and to have a negative feedback structure;
a variable resistance device configured to have a resistance value that varies with the write current; and
a write reference voltage generator configured to generate the write reference voltage,
wherein the write reference voltage generator includes a digital-to-analog converter (DAC).

2. The semiconductor device of claim 1, further comprising:
a current path configured to transfer the write current to the variable resistance device in response to a selection signal.

3. The semiconductor device of claim 1, wherein the variable resistance device includes any of a metal oxide material and a phase-change material, and has a structure where a tunnel barrier layer is interposed between two magnetic layers.

4. A semiconductor device, comprising:
a write reference voltage generator configured to generate a write reference voltage in a write mode;
a comparison unit configured to compare a voltage at a supply node with the write reference voltage and to produce a comparison result;
a write current supplying unit configured to supply a predetermined write current to the supply node based on the comparison result of the comparison unit; and
a variable resistance device configured to have a resistance value that varies with the write current.

5. The semiconductor device of claim 4, further comprising:
a global path configured to transfer the write current from the supply node to a coupling node in response to a global selection signal; and
a local path configured to transfer the write current from the coupling node to the variable resistance device in response to a local selection signal.

6. The semiconductor device of claim 5, wherein the global path includes:
a global switching unit configured to switch in response to the global selection signal; and
a global bit line configured to transfer the write current to the local path through the global switching unit.

7. The semiconductor device of claim 5, wherein the local path includes:
a local switching unit configured to switch in response to the local selection signal; and
a local bit line configured to transfer the write current to the variable resistance device through the local switching unit.

8. The semiconductor device of claim 4, wherein the write reference voltage generator includes a digital-to-analog converter (DAC).

9. The semiconductor device of claim 4, wherein the write current supplying unit includes a pull-up driver for driving the supply node with a predetermined driving voltage in response to the comparison result of the comparison unit.

10. The semiconductor device of claim 4, wherein the variable resistance device includes any of a metal oxide material and a phase-change material, and has a structure where a tunnel barrier layer is interposed between two magnetic layers.

11. A semiconductor device, comprising:
a variable resistance device configured to have a resistance value that varies with a current flowing though both ends;
a current transfer path configured to transfer a write current for writing a data to the variable resistance device and a read current for reading the data to the variable resistance device;
a write circuit configured to generate the write current and supply the write current to the current transfer path in a write mode; and
a read circuit configured to generate the read current and supply the read current to the current transfer path in a read mode,
wherein the write circuit includes:
a write reference voltage generator configured to generate a write reference voltage; and
a write current generator configured to generate the write current corresponding to the write reference voltage, and to have a negative feedback structure.

12. The semiconductor device of claim 11, wherein power sources connected to the write circuit and the read circuit supply different voltages to the write circuit and the read circuit, respectively.

13. The semiconductor device of claim 11, wherein the write circuit further includes a write coupler that switches in response to a write enable signal and selectively transfers the write current to the current transfer path.

14. The semiconductor device of claim 11, wherein the write current generator includes:
- a comparison unit configured to compare a voltage at a supply node with the write reference voltage and to produce a comparison result; and
- a write current supplying unit configured to supply the write current to the supply node based on the comparison result of the comparison unit.

15. The semiconductor device of claim 14, wherein the write current supplying unit includes a pull-up driver configured to drive the supply node with a predetermined driving voltage in response to the comparison result of the comparison unit.

16. The semiconductor device of claim 11, wherein the write reference voltage generator includes a digital-to-analog converter (DAC).

17. The semiconductor device of claim 11, wherein the current transfer path includes:
- a local switching unit configured to switch in response to a local selection signal;
- a local bit line configured to transfer the write current or the read current to the variable resistance device through the local switching unit;
- a global switching unit configured to switch in response to a global selection signal; and
- a global bit line configured to transfer the write current or the read current to the local bit line through the global switching unit.

* * * * *